(12) United States Patent
Miers et al.

(10) Patent No.: US 11,575,198 B2
(45) Date of Patent: Feb. 7, 2023

(54) SYSTEMS AND METHODS FOR AUTOMATED TESTING AND CALIBRATION OF PHASED ARRAY ANTENNA SYSTEMS

(71) Applicant: Ball Aerospace & Technologies Corp., Boulder, CO (US)

(72) Inventors: Zachary T. Miers, Broomfield, CO (US); Joseph E. Diener, Westminster, CO (US); Peter J. Moosbrugger, Lafayette, CO (US)

(73) Assignee: Ball Aerospace & Technologies Corp., Boulder, CO (US)

( * ) Notice: Subject to any disclaimer, the term of this patent is extended or adjusted under 35 U.S.C. 154(b) by 0 days.

(21) Appl. No.: 16/805,213

(22) Filed: Feb. 28, 2020

(65) Prior Publication Data

US 2020/0280129 A1    Sep. 3, 2020

Related U.S. Application Data

(60) Provisional application No. 62/812,623, filed on Mar. 1, 2019.

(51) Int. Cl.
*H01Q 3/26* (2006.01)
*G01R 29/10* (2006.01)

(52) U.S. Cl.
CPC ............. *H01Q 3/267* (2013.01); *G01R 29/10* (2013.01)

(58) Field of Classification Search
CPC ........ H01Q 3/267; H01Q 1/38; H01Q 21/065; H01Q 1/523; H01Q 21/0025; H01Q 1/247;

(Continued)

(56) References Cited

U.S. PATENT DOCUMENTS 10,955,451 B2 *   3/2021   Wang ................. G01R 31/2822
2017/0248674 A1 *   8/2017   Patton ................. G01R 35/005

(Continued)

FOREIGN PATENT DOCUMENTS

DE    102005011127    9/2006
GB    2384914    8/2003
WO    WO 2018/073622    4/2018

OTHER PUBLICATIONS

Coulter Jr. et al. "Aegis Near-Field Antenna Test System Automated Test System for Phased Array Antennas," Department of the Navy Sea Systems Command, Jun. 1980, Navsea MT S-475-77, NOSC TR 499, 124 pages.

(Continued)

*Primary Examiner* — Andrea Lindgren Baltzell
*Assistant Examiner* — Yonchan J Kim
(74) *Attorney, Agent, or Firm* — Sheridan Ross P.C.

(57) ABSTRACT

Antenna test systems and methods are disclosed. An antenna test system as disclosed herein can include an X-Y isolation structure that defines a plurality of unit cells, a plurality of coupling elements, with at least one coupling element within each unit cell, and a Z isolation structure. The size and general configuration of the unit cells are selected to allow the individual antenna elements of an array antenna to be placed within a unit cell. Each unit cell thus isolates an antenna element. The disclosed methods include passing energy between antenna elements and corresponding unit cells to characterize the performance of the antenna. An antenna test system as disclosed herein enables the costs associated with testing phased array antenna systems, including but not limited to antennas used in 5G communication systems, to be reduced as compared to prior techniques.

15 Claims, 6 Drawing Sheets

(58) Field of Classification Search
CPC ........... H01Q 3/38; H01Q 21/22; H01Q 3/28;
H01Q 3/30; H01Q 21/061; H01Q 21/296;
H01Q 21/08; G01R 29/10; H04B 17/21;
H04B 17/12; H04B 17/19; H04B 17/14
See application file for complete search history.

(56) References Cited

U.S. PATENT DOCUMENTS

2018/0183150 A1\* 6/2018 Sienkiewicz ............ H01Q 1/38
2021/0194601 A1\* 6/2021 Shiota .................... H04B 17/12

OTHER PUBLICATIONS

Fenn et al. "Low-Sidelobe Phased Array Antenna Characteristics Using the Planar Near-Field Scanning Technique: Theory and Experiment," Lincoln Laboratory, Feb. 14, 1990, Technical Report 870, 44 pages.
International Search Report and Written Opinion for International (PCT) Patent Application No. PCT/US2020/020451, dated Jun. 8, 2020 16 pages.
International Preliminary Report on Patentability for International (PCT) Patent Application No. PT/US2020/020451, dated Sep. 16, 2021 11 pages.

\* cited by examiner

SYSTEMS AND METHODS FOR AUTOMATED TESTING AND CALIBRATION OF PHASED ARRAY ANTENNA SYSTEMS

CROSS-REFERENCE TO RELATED APPLICATIONS

This application claims the benefit of U.S. Provisional Patent Application Ser. No. 62/812,623, filed Mar. 1, 2019, the entire disclosure of which is hereby incorporated herein by reference.

FIELD

The present disclosure is directed to systems and methods for testing phased array antenna systems.

BACKGROUND

Radio frequency (RF) communication links are commonly used to transfer information and to control devices. One increasingly important consideration in designing and implementing RF antennas, including but not limited to antennas for 5G communication systems, is the expense of manufacturing and testing such antennas and the associated circuits.

In many antenna systems, planar patch type conductors, formed on one or more layers of circuit board, are used as radiating elements. The radiating elements are typically disposed in a two-dimensional planar array. This arrangement can be used to implement a phased array antenna, which allows beams to be steered and otherwise controlled, for example to provide desired levels of gain relative to a mobile or other device located at some distance from the phased array antenna.

Phased array antenna systems have a variety of applications in present day communications and surveillance systems. For example, phased array antenna systems can be used in high performance wireless communications networks, such as Multi Input Multi Output (MIMO) antenna arrays associated with fifth generation 5G cellular communications systems. As another example, phased array antenna systems can be used in RADAR surveillance and tracking systems. In such applications, the beam pattern produced by the antenna is often dynamically steered and/or modulated. In order to provide for the steering or modulation of a beam, each radiating element of the array is associated with feed circuitry. Before deploying a phased array antenna, it is desirable to test the assembly to make sure it is operating an intended.

The testing of a phased array antenna has often involved the use of a far-field range. As can be appreciated by one of skill in the art, a far field range requires a significant amount of physical space, and testing using such a range can thus be time consuming and expensive. Alternatively, a near-field range can be used. However, testing using a near-field range requires careful calibration and accurate phase information, and for these reasons can also be time consuming and expensive to implement. Moreover, near-field testing can be more prone to errors than far-field testing, even with careful calibration of the range. For example, the data obtained using near-field testing often must be transformed to far field parameters in order to assess expected real-world performance. Near-field and direct measurement testing can include using probe-based measurement fixtures, pogo-pin measurement systems, and 2/3/4 position probe connections. However, these approaches can require probe compensation, are prone to errors, may be incapable of identifying individual elements that are faulty, may be incapable of identifying a specific problem with a faulty element, and can be time consuming to perform.

In addition, range testing of a phase array antenna often requires the individual operation of radiating elements. However, the impedance of the antenna during operation of an individual radiating element is different than the impedance during operation of multiple element simultaneously. According, such testing is prone to errors.

SUMMARY

Embodiments of the present disclosure provide systems and methods for isolating individual radiating/receiving elements of an electronically steerable array and/or to quickly test and calibrate individual sections of an electronically steerable array at both the element and system level without the need for physical, multiple test connectors on the electronically steerable array hardware, or hard test points. Embodiments of the present disclosure allow testing while maintaining high element to element isolation, individual gain and phase measurement, and can maintain a high level of polarization diversity during the test process.

Embodiments of the present disclosure provide test systems and devices that include an isolation matrix or assembly for array antennas. The isolation assembly or test device can include a grid or X-Y isolation structure that is dimensioned to provide isolation of individual antenna elements of the array under test. The test device also includes an array having a plurality of tuned coupling elements that is disposed on a planar substrate, dimensioned, and configured such that one coupling element is provided for each antenna element in the array under test. Isolation of the individual antenna elements can be completed or enhanced by a planar z-axis radiation blocker or isolation structure that is located on a side of the array of tuned coupling elements opposite a side facing the antenna elements. Moreover, the array of coupling elements and the X-Y isolation structure, in combination with the Z-axis isolation structure, define a plurality of chambers or unit cells, with one antenna element of the array under test within one of the chambers when the test device is placed on that antenna array.

Embodiments of the present disclosure further provide test methods that enable the automated testing of phased array antenna systems, without requiring the use of a large range or specialized test facility. The methods can include injecting or receiving signals using a test system or device that provides an X-Y grid radiation blocker and a z-axis radiation blocker to isolate the individual antenna elements of the array under test using coupling elements positioned adjacent the antenna elements. More particularly, the methods can include injecting or receiving energy relative to individual antenna elements, without interference due to coupling with other antenna elements or components. In addition, tuning of individual elements or other components can be performed.

Additional features and advantages of embodiments of the disclosed systems and methods will become more readily apparent from the following description, particularly when taken together with the accompanying drawings.

DETAILED DESCRIPTION

Figure 1:
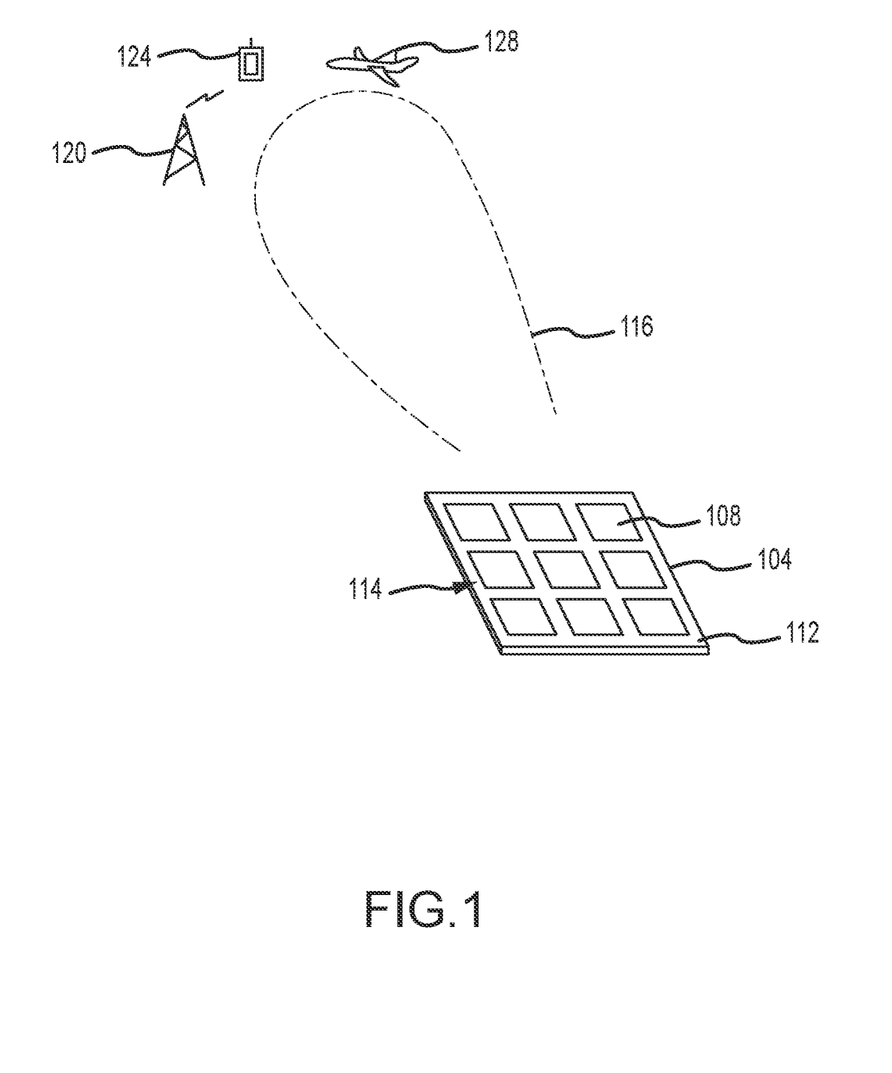
FIG. 1 is a top perspective view of an example of a phased array antenna that can be tested using systems and methods in accordance with embodiments of the present disclosure.

As depicted in FIG. 1, a typical electronically steerable array antenna 104, also referred to herein as a phased array antenna, consists of multiple individual radiating elements or antenna elements 108, disposed on a planar antenna substrate 112 in the form of an array or matrix 114. In this example, the array is a two-dimensional array; however, other arrangements are possible. The elements 108 in a particular antenna 104 can be operated to receive, transmit, or transmit and receive electromagnetic signals 116. The electromagnetic signals 116 can include communication signals sent between the antenna 104 and communication system base stations 120, mobile devices 124, or other communication devices, signals sent as part of radar systems to determine the presence and location of distant objects 128, signals received from other transmission sources that the antenna is operational to detect as part of a signal or threat warning system, or any other purpose.

Figure 2:
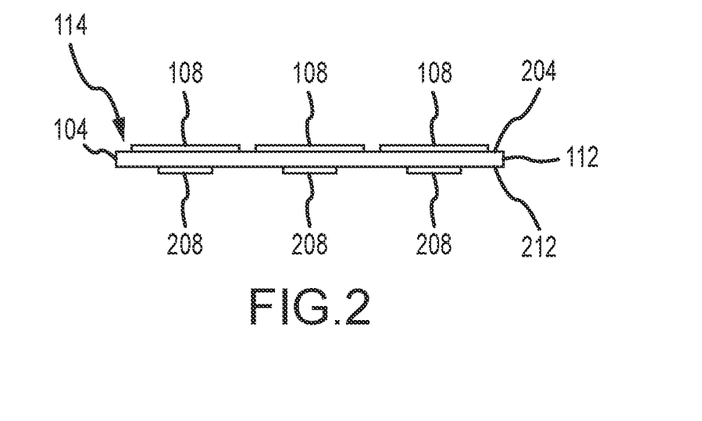
FIG. 2 is a side elevation view of an example phased array antenna.

With reference now to FIG. 2, an example antenna 104 is depicted in a side elevation view. As shown, the antenna elements 108 are disposed on a first side or surface 204 of the antenna substrate 112, and various circuit or feed network components 208 are disposed on a second side 212 of the antenna substrate 112.

Figure 3:
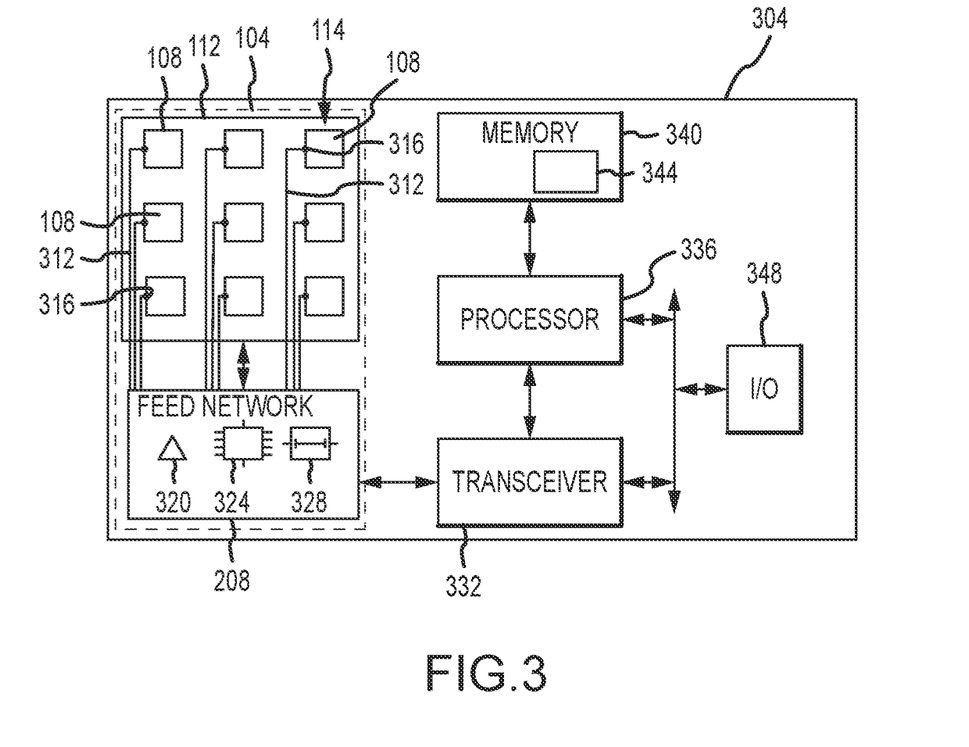
FIG. 3 depicts components of an example phased array antenna.

FIG. 3 is a block diagram depicting various components of an example antenna system 304 incorporating an antenna 104. In general, feed lines 312 connect components of the feed network 208 to individual antenna elements at feed points 316 on or associated with each antenna element 108. As can be appreciated by one of skill in the art after consideration of the present disclosure, multiple feed points 316 and associated feed lines 312 can be provided for each element 108, for example to support or facilitate the receipt and/or transmission of multiple signals simultaneously.

The feed network 208 can include various components, such as, but not limited to, amplifiers 320, integrated circuits 324, delay circuits 328, switches, delay lines, phase shifters, attenuators, and the like. Various components of the feed network 208 can be provided for individual antenna elements. In addition, various components of the feed network 208 can be shared by multiple antenna elements 108. As can be appreciated by one of skill in the art after consideration of the present disclosure, by controlling a phase delay, amplitude, or other parameters of individual antenna elements 108, the direction of the beam 116 produced by the array 114 of antenna elements 108 can be controlled in elevation and azimuth.

Signals are passed between the feed network 208 and a transceiver 332. As used herein, a transceiver 332 can signify a receiver, a transmitter, or a combined receiver and transmitter. Depending on the end use of the antenna 104, the transceiver 332 can operate to, for example, modulate and demodulation communication signals, or send and receive radar signals. The transceiver 332 can be controlled by or operate in connection with a processor 336. The processor 336 can include a general purpose programmable processor, field programmable gate array (FPGA), controller, or other device or devices alone or in various combinations. The processor 336 can operate in connection with a memory 340. The memory 340 can include volatile and nonvolatile data storage, for example RAM, SDRAM, solid-state memory, or the like. In addition, the memory 340 can store application programming 344 that can be executed by the processor 336 in connection with the operation of the antenna system 304. The antenna system 304 can additionally include an input/output interface or facility 348. The input/output interface 348 and provide an operational connection between the antenna system 304 and other, remote or local, control systems, output devices, and the like. The various components of the antenna system 304 can be connected to one another through dedicated signal lines, and/or shared communication buses.

In normal operation, the antenna elements 108 perform together in unison and cannot be isolated from each other, either during traditional far-field testing or during probe-based testing, as the antenna elements 108 will couple energy from one element to another, significantly distorting the accuracy of a single element measurement.

Accordingly, verifying the proper operation of a multiple element 108 antenna 104 and identifying individual failed or sub-standard elements has been difficult. Moreover, identifying individual components of an antenna 104 or antenna system 204 having multiple elements 108 or associated feed networks 208 components that have failed or are performing at sub-standard levels has been difficult or impossible using traditional techniques.

Figure 4:
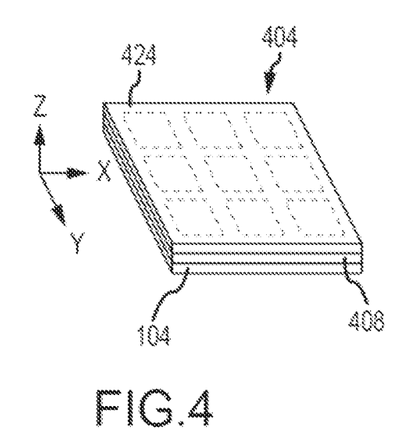
FIG. 4 is a top perspective view of a test device and a phased array antenna in accordance with embodiments of the present disclosure.

To reduce this coupling effect, embodiments of the present disclosure provide a test device or fixture 404 (see FIGS. 4-9) that can be placed on an antenna 104 to isolate signals related to individual elements 108 of an array antenna 104 for testing purposes. As illustrated in FIG. 4, during test operations, the test fixture 404 is placed directly on the first surface 204 of the antenna 104. The test fixture 404 functions to isolate the signals associated with individual antenna elements 108 from one another, even while operating all or selected sets of the antenna elements 108. In addition, the test fixture 404 enables energy to be individually injected to or received from any single antenna element 108 in the electronically steerable array 114 structure.

The test device or fixture 404 generally consists of two components that can be built as a single integrated item (e.g. integrated into a single PCB/PWB), or built using multiple separate items. However, to identify each aspect with particularity, the description will be split up to into individual sections that demonstrate these different aspects of the test fixture 404.

Figure 8:
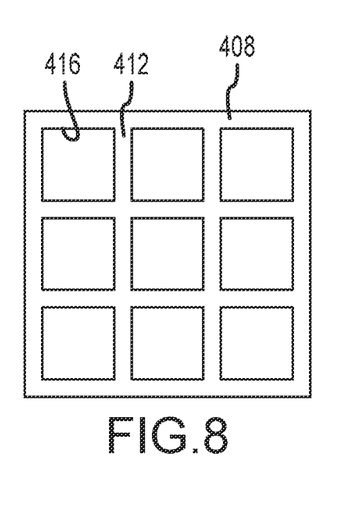
FIG. 8 is a bottom plan view of an X-Y isolation structure of a test device in accordance with embodiments of the present disclosure.

A first component of the test fixture 404 is an isolation feature, referred to herein as an isolation grid or X-Y isolation structure 408. The isolation grid 408 prevents X and Y electromagnetic interference (EMI) and/or radio frequency (RF) coupling from any one of the antenna elements 108 into any other elements 108 within the antenna 104. More particularly, the isolation grid 408 includes walls 412 that define apertures 416. One aperture 416 is provided for each antenna element 108 within the array 114. The walls 412 are further configured to define a first side or mounting surface 420 that contacts the first surface 204 of the antenna substrate 112 when the test fixture 404 is placed on the antenna 104 for testing purposes. Moreover, the apertures 416 surround, but do not contact, individual antenna elements 108. The thickness of the X-Y isolation structure 408 can be selected to place coupling elements 444 at a desired distance from the corresponding antenna elements 108. In accordance with embodiments of the present disclosure, the X-Y isolation structure 408 is formed from or using an electrically conductive material.

Figure 5:
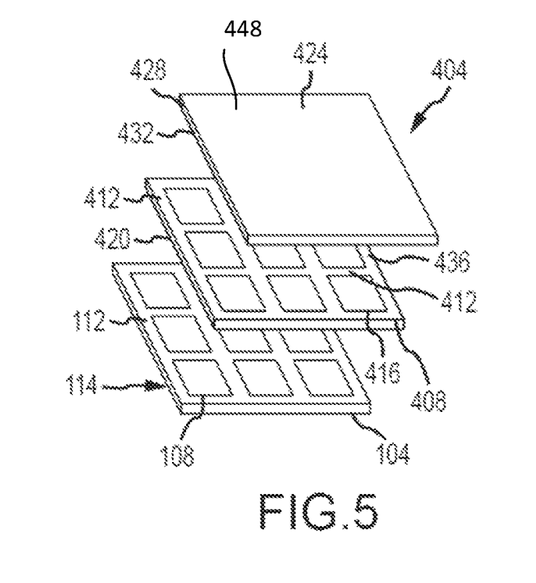
FIG. 5 is an exploded top perspective view of a test device and a phased array antenna in accordance with embodiments of the present disclosure.
Figure 6:
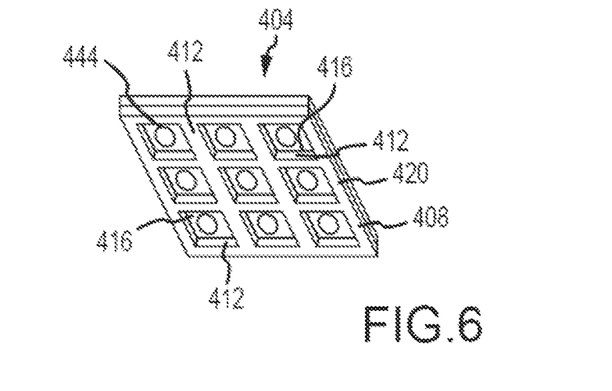
FIG. 6 is a bottom perspective view of a test device in accordance with embodiments of the present disclosure.

Another component of the test fixture 404 is the cover assembly 424. The cover assembly 424 includes a Z-axis absorption structure 428 with a generally planar first surface 432 that is joined to a second side or surface 436 of the X-Y isolation structure 408 defined by surfaces of the walls 412 opposite the first side 420. Together, the absorption structure 428 and the apertures 416 in the walls 412 of the X-Y isolation structure 408 form a plurality of unit cells 440.

Figure 7:
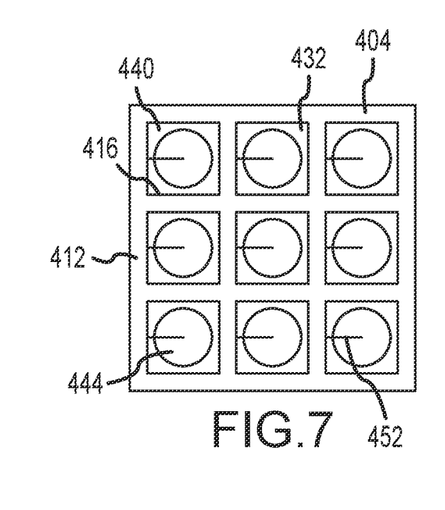
FIG. 7 is a bottom plan view of a test device in accordance with embodiments of the present disclosure.

The cover assembly 424 additionally includes a plurality of coupling elements 444 disposed on the first surface 432 or a second surface 448 of the absorption structure 428. In accordance with embodiments of the present disclosure, at least one coupling element 444 is disposed within or adjacent each unit cell 440. Accordingly, when the test fixture 404 is placed over the antenna 104, each antenna element 108 is located within a corresponding unit cell 440, and adjacent but spaced apart from a coupling element 444. In accordance with embodiments of the present disclosure, each coupling element 444 is connected to a feed line 452. The feed lines 452 generally connect to the coupling elements 444 to test electronics, as discussed elsewhere herein. Like the coupling elements 444, the feed lines 452 can mirror those included in the antenna 104 under test, for example to provide for polarization or other signal diversity characteristics. The feed lines 452 or portions thereof can be formed on a surface 432 or 448 of the absorption structure 428. Alternatively or in addition, the feed lines 452 or portions thereof can be formed within layers of an absorption structure 428 formed from or including a circuit board or other structure that includes internal wirings. The feed lines 452 can carry energy received at the coupling elements 444 from the antenna elements 108 to the test electronics, can deliver energy from the test electronics to the antenna elements 108 via the coupling elements 444, or both. As a result of the isolation provided by the test fixture 404, the individual testing of the antenna elements 108 can be performed in parallel, thereby shortening the time required to fully test each of the antenna elements 108.

The coupling elements 444 can be formed from planar patches of conductive material, such as aluminum, copper, or some other metal. The shape of the coupling elements 444 can mirror or be the same as the shape of the antenna elements 108. Alternatively, the shape of the coupling elements 444 can be different than the shape of the antenna elements 108, for example as depicted in the figures, where the example system is depicted as including square antenna elements 108 and round coupling elements 444. The size and shape of the coupling elements 444 can be variable, depending on the intended application, and the desired frequency, feeding, and coupling characteristics. In accordance with at least some embodiments of the present disclosure, the coupling elements 444 are tuned to inject or receive >60% of the total energy passed between any one coupling element 444 and the associated antenna element 108. This can have the effect of increasing cross pole interference, but if cross pole accuracy is not required embodiments of the present disclosure are operational even where any antenna element 108 and coupling element 444 pair passes receives less than 30% of the injected/received energy. In practice, embodiments of the test system disclosed herein can reach isolation levels of <−75 dB element to element isolation (<0.001%) and >99% of power transmission from coupler to electronically steerable array element.

Figure 9:
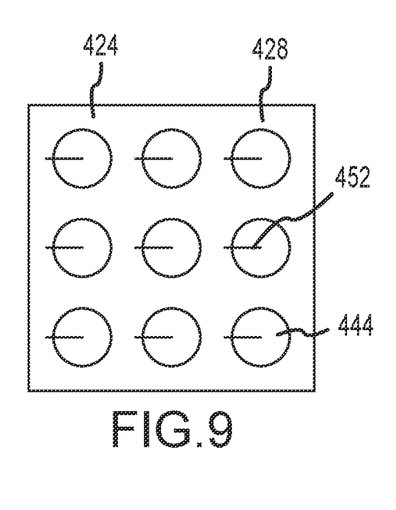
FIG. 9 is a bottom plan view of a Z isolation structure of a test device in accordance with embodiments of the present disclosure.

Embodiments of the present disclosure can include a cover assembly 424 that implements a z-directed radiation blocker or Z isolation structure 428 that includes or is integrated with the feed lines 452 and/or the coupling elements and 444. In accordance with further embodiments of the present disclosure, the cover assembly 424 can be implemented as a PCB or printed wiring board (PWB). Accordingly, the Z-isolation structure 428, the coupling elements 444, and/or the feed lines 452 can be formed from or joined to a PCB or other multilayered structure. Alternatively, the Z isolation structure 428 can be implemented separately as a piece of conductive material that fully covers the unit cells formed around the electronically steerable array 114 elements 108 by the X-Y isolation structure 408, and allows a feeding connection to the coupling elements 444.

Figure 10:
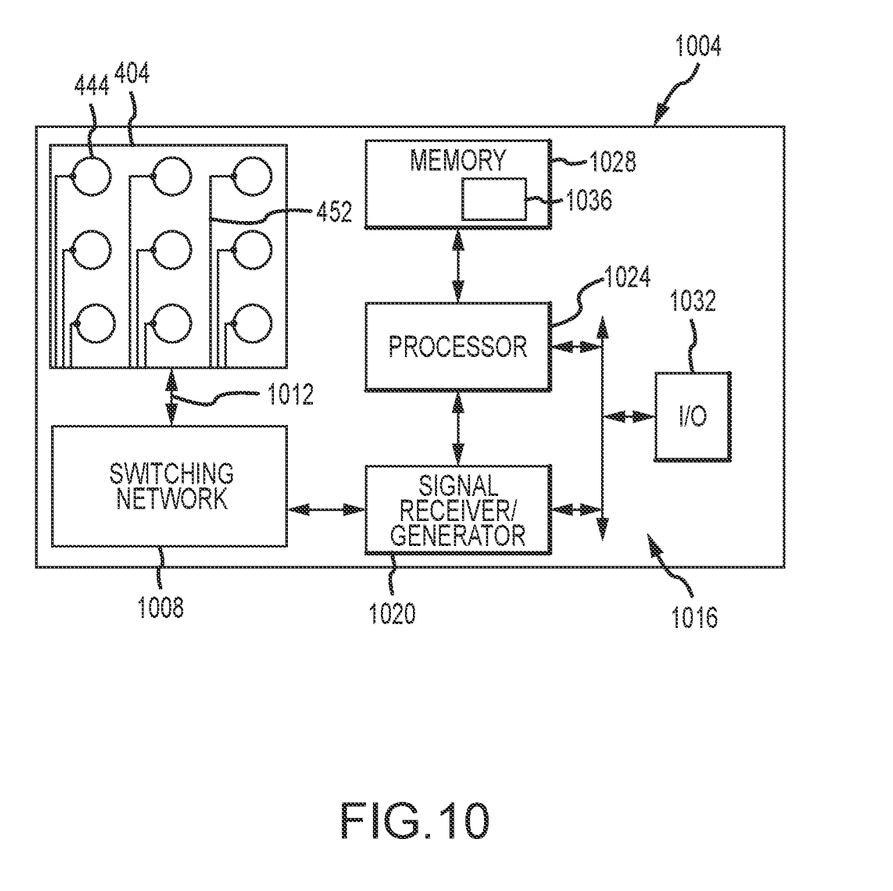
FIG. 10 is a functional block diagram depicting components of a test system incorporating a test device in accordance with embodiments of the present disclosure.

With reference now to FIG. 10, components of a test system 1004 incorporating a test device or fixture 404 in accordance with embodiments of the present disclosure are depicted in block diagram form. As depicted in the figure, the test system 1004 generally includes a test fixture 404 as discussed herein. The feed lines 452 of the test fixture 404 are connected to a switching network 1008. The switching network 1008 can be integral to the test fixture 404, or can be provided as part of a test system 1004 assembly that is connected to the test fixture 404 via a coupler or interface 1012. The switching network 1008 generally operates to connect one or more coupling elements 444 to test electronics 1016 provided as part of the test system 1004. The test electronics 1016 generally include a signal receiver/generator 1020 a processor 1024, memory 1028, and an input/output interface 1032.

The signal receiver/generator 1020 generally operates to send signals to or receive signals from the coupling elements 444 via the switching network 1008. Signals can be sent to or received from coupling elements 444 individually. Alternatively, the signals can be sent to or received from sets of multiple coupling elements coupling elements 444 simultaneously. In accordance with still other embodiments of the present disclosure, signals can be sent to or received from all of the coupling elements 444 within the test fixture 404 simultaneously. In accordance with still other embodiments of the present disclosure, the signal receiver/generator 1020 can provide signals to the antenna elements 108 of the antenna 104 under test, and/or can receive signals collected by the antenna elements 108 of the antenna 104 under test. In general, regardless of whether signals are passed between a single coupling element 444 or multiple coupling elements 444 at a particular point in time, all of the antenna elements 108 of the antenna 104 under test are operated simultaneously, as discussed in greater detail elsewhere herein. In accordance with the least some embodiments of the present disclosure, the signal receiver/generator 1020 is a radio frequency transceiver.

The processor 1024 can include a general purpose programmable processor, field programmable gate array (FPGA), controller, or other device or devices alone or in various combinations. The processor 1024 can operate in connection with the memory 1028. The memory 1028 can include volatile and nonvolatile data storage, for example RAM, SDRAM, solid-state memory, or the like. The memory can store application programming 1036 can be executed by the processor 1024 to control operation of the test system 1004 and the components thereof.

The input/output interface 1032 can include a coupling or other interface to an antenna system 104 under test. Accordingly, embodiments of the present disclosure allow the test system 1004 to control the operation of an antenna 104. Moreover, in accordance with the least some embodiments, the signal receiver/generator 1020 of the test system 1004 can take the place of and perform the function of a transceiver 332 of an antenna system 304. Accordingly, embodiments of the present disclosure allow components of an antenna 104, such as but not limited to the antenna elements 108 and the feed network components 208, to be tested separately from the electronics of an antenna system 304. In accordance with still other embodiments of the present disclosure, signals received at the elements 108 of an antenna 104 under test can be passed from the feed network 208 of the antenna 104 under test to the test system 1004 via the input/output interface 1032. Those signals can then be demodulated or otherwise processed by the signal receiver/generator 1020 or other components of the test system 1004. In accordance with still other embodiments of the present disclosure, the input/output interface 1032 can connect to various input/output devices that enable a human operator to provide control instructions regarding operation of the test system 1004. In accordance with still further embodiments of the present disclosure, the input/output interface 1032 can connect the test system 1004 to other systems, located either remotely or locally relative to the test system 1004.

The test system 1004 and associated antenna 104 allows for a signal to flow into or out of the coupling elements 444, which will inject/receive energy into/from the now isolated individual antenna elements 108. Test fixture 404 of the test system 1004 can thus be set on top of the electronically steerable array antenna 104, clamped to the electronically steerable array antenna 104, or connected to the electronically steerable array antenna 104 so that the separation between any of the components, including between the antenna elements 108, is minimized. Using this system and well-known measurement techniques, the phase, amplitude, and polarization information can be extracted from the electronically steerable array at an element level. The extracted values can then be used to characterize and calibrate the array.

Figure 11:
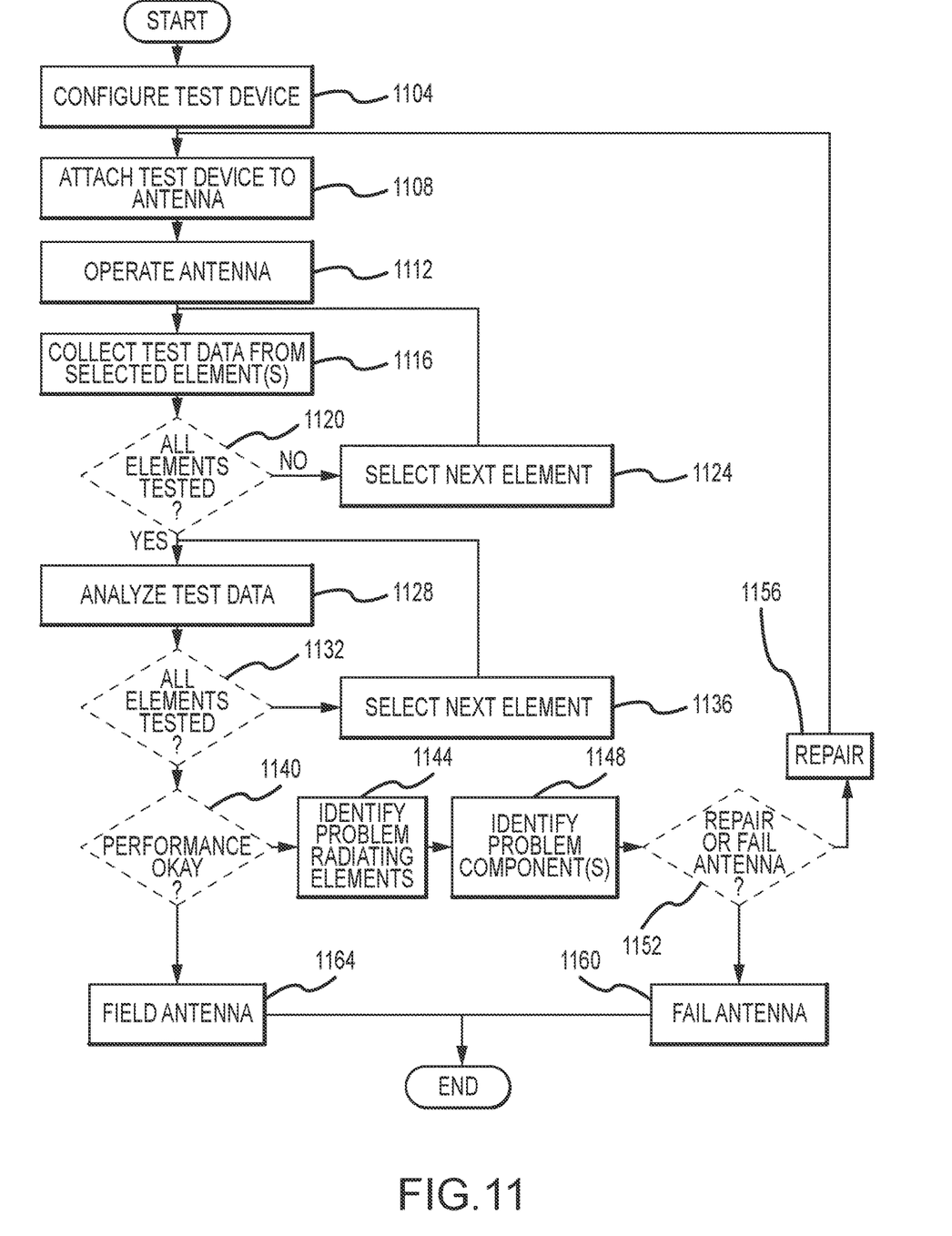
FIG. 11 is a flowchart illustrating aspects of the operation of a test system in accordance with embodiments of the present disclosure.

With reference now to FIG. 11, aspects of the operation of a test system 1004 to test a multiple element array antenna 1004 in accordance with embodiments of the present disclosure are depicted. Initially, at step 1104, the test device or fixture 404 is configured. This can include providing an X-Y isolation structure 408 having apertures 416 formed therein that are sized to accommodate the antenna elements 108 of the antenna 104 to be tested. As can be appreciated by one of skill in the art after consideration of the present disclosure, one such aperture 416 is provided for each antenna element 108 in the antenna 104. In addition, configuring the test fixture 404 includes providing a plurality of coupling elements 444, with one coupling element provided for each antenna element 108 of the antenna 104 under test, and a Z-axis absorption structure 428. In addition, each coupling element 444 can be configured according to the particular frequency, bandwidth, and other operating parameters of the antenna 104 under test.

The test fixture 404 configured for the antenna 104 under test is then attached to the antenna 104. This can include simply placing the mounting surface 420 of the test fixture 404 on the first surface 204 of the antenna 104, such that each antenna element 108 is placed within a unit cell 440 of the test fixture 404. Where necessary, for example due to the orientation of the antenna 104 during the test, or if otherwise desired or required, the test fixture 404 can be secured to the antenna 104, for example using clamps, threaded fasteners, releasable adhesives, or other measures.

After securing the test fixture 404 to the antenna 104, the antenna 104 is operated (step 1112). Operating the antenna generally includes operating the antenna 104 in the same or a similar way as the antenna 104 will be operated when operationally deployed. For example, all of the elements 108 of the antenna 104 may be operated simultaneously. Alternatively, one or more subsets of the antenna elements 108 may be operated simultaneously. By operating the antenna elements 108 in the same combinations as when the antenna will be in actual use, the operational characteristics of the antenna 104 under conditions of actual use can be tested.

While the antenna 104 is operated, test data is collected for selected antenna elements 108 (step 1116). In accordance with embodiments of the present disclosure, an antenna 104 can be tested in transmit, receive, or both transmit and receive modes. Testing the antenna 104 in a transmit mode generally includes transmitting a signal from all or a set of the antenna elements 108 of the antenna 104 under test simultaneously, and receiving the transmitted signal at the associated coupling elements 444 of the test fixture 404. Testing the antenna 104 in a receive mode generally includes using the signal generator of the 1020 of the test system 1004 to pass a signal to one or more coupling elements 444, and collecting a signal from one or more associated antenna elements 108.

In accordance with embodiments of the present disclosure, test data may be collected in the form of a signal passed from an antenna element 108 and received at a single coupling element 444, and passed to the test electronics 1016; or test data may be collected in the form of a signal received at a single antenna element 108 that was passed to it by a coupling element 444. That is, test data can be collected in relation to individual antenna elements 108 in series. After test data has been collected for a selected antenna element 108, a determination is made as to whether all of the antenna elements 108 have been tested (step 1120). If antenna elements 108 remain to be tested, a next element 108 is selected (step 1124). The process then returns to step 1116, and the next element 108 is tested. In general, the selection of an element 108 to test is made at the direction of the processor 102 for executing the test system application programming 1036, and the selection is physically implemented through operations of the switching network 1008.

In accordance with further embodiments of the present disclosure, data can be collected for multiple antenna elements 108 simultaneously. The ability to collect data for multiple antenna elements 108 simultaneously depends on the number of physical and processing channels provided by the test system 1004. Thus, embodiments of the present disclosure can provide a test system 1004 capable of testing the signals for all of the antenna elements 108 of an antenna 104 simultaneously. In accordance with other embodiments of the present disclosure, the test system 1004 can be capable of testing multiple antenna elements 108, but less than all of the antenna elements 108 of an antenna 104, simultaneously. Whether all of the antenna elements 108, some of the antenna elements 108, or a single antenna element 108 of an antenna 104 is tested at any one point in time, the antenna 104 is, as noted above, operated as if it were deployed. That is, antenna element 104 is operated using all or multiple antenna elements 108 simultaneously in a coordinated fashion.

At step 1128, the collected test data is analyzed. Analyzing the test data can include determining whether individual antenna elements 108 of the antenna 104 are operating as expected. Notably, embodiments of the present disclosure allow the performance of individual antenna elements 108, and the feed network 208 components of each antenna element 108, to be assessed. At step 1132, a determination is made as to whether all of the antenna elements 108 have been assessed. If less than all of the antenna elements 108 of been assessed, a next antenna element 108 is selected (step 1136), and the process returns to step 1128, at which test data for a next antenna element is assessed.

After all of the antenna elements 108 have been assessed, a determination is made as to whether the performance of the elements is within specification (step 1140). Any problem radiating elements 108 can be identified at step 1144. For the radiating elements 108 having performance characteristics identified as being outside of the specified parameters, problem components associated therewith can be identified (step 1148). In particular, based on the characteristics of the test data, the nature of the performance deficiency or deficiencies related to a particular antenna element 108 can be identified. The antenna 104 can then be repaired or failed (step 1152). As used herein, repair can include calibration or recalibration of antenna 104 components, such as but not limited to feed network components 208. Alternatively or in addition, repair can include the replacement or repair of discrete or integrated antenna 104 components, such as but not limited to feed network components 208. If the antenna is repaired and/or recalibrated (step 1156), the process sets of testing the antenna 104 can be repeated. Accordingly, where the test fixture 404 has been removed from the antenna 104 for repair or calibration purposes, the process can return to step 1108. Where the test fixture 404 has not been removed from the antenna 104, the process can return to step 1112.

If it is determined that the antenna 104 cannot be repaired, the antenna can be declared failed, in which case it can be discarded, recycled, or rebuilt (step 1160). If the performance of the antenna was determined to be acceptable, the antenna 104 is ready to be fielded and placed in operation (step 1164). The process can then end.

In accordance with embodiments of the present disclosure, the test fixture 404 developed for a particular antenna 104 array 114 spacing, element 108 sizing, and operating frequency characteristics can be reused to test multiple antennas 104. Accordingly, embodiments of the present disclosure are well-suited to testing antennas produced in relatively large numbers in a production facility. In accordance with further embodiments of the present disclosure, a test fixture 404 can be used to test prototype or one-off antennas 104, provided to the spacing and sizing of the included antenna elements 108 fall within the unit cells 440 of the test fixture 404. Moreover, the test electronics 1016 of the test system 1004 can be reconfigured as required, to test the receiving characteristics, transmitting characteristics, and various performance parameters thereof, of various antenna 104 antenna operating modes.

As can be appreciated by one of skill in the art after consideration of the present disclosure, the configuration and number of unit cells provided by a particular instance of the isolation structure is determined at least in part by the configuration and number of antenna elements 108 of the antenna or antennas 104 to be tested. Similarly, any configuration and number of antenna elements 108 can be tested. Although various examples have been discussed in which the number of unit cells 440 of a test fixture 404 match the number of antenna elements 108 of the antenna under test, other configurations are possible. For example, a test fixture with the same center to center element spacing and sufficiently large apertures 416 as an antenna 404 to be tested can be used to test that antenna even if the number of rows or columns of elements 108 is less than the number of rows and columns of unit cells 440.

As discussed herein, embodiments of the present disclosure provide test systems and methods that enable the economical and accurate testing of multiple element 108 antennas 104. Embodiments of the present disclosure further allow for multiple elements 108 to be tested in parallel, reducing testing and calibration costs. Moreover, by providing isolation relative to individual elements 108, faulty or out of specification antenna elements 108 and associated circuitry can be identified. Accordingly, embodiments of the present disclosure provide for the possibility of economical repair and calibration of multiple element 108 antennas 104. Moreover, embodiments of the present disclosure enable testing and calibration in a portable system that does not require large spaces or carefully controlled test environments.

The foregoing description has been presented for purposes of illustration and description. Further, the description is not intended to limit the disclosed systems and methods to the forms disclosed herein. Consequently, variations and modifications commensurate with the above teachings, within the skill or knowledge of the relevant art, are within the scope of the present disclosure. The embodiments described hereinabove are further intended to explain the best mode presently known of practicing the disclosed systems and methods, and to enable others skilled in the art to utilize the disclosed systems and methods in such or in other embodiments and with various modifications required by the particular application or use. It is intended that the appended claims be construed to include alternative embodiments to the extent permitted by the prior art.

What is claimed is:

1. An antenna test fixture, comprising: an X-Y isolation structure, wherein the X-Y isolation structure includes walls that define sidewalls of a plurality of unit cells, wherein the sidewalls of the walls defined by the X-Y isolation structure extend along a Z axis direction, wherein a first end of the walls of the X-Y isolation structure define a first surface that lies within a first X-Y plane, wherein a second end of the walls of the X-Y isolation structure define a second surface that lies within a second X-Y plane, wherein the first X-Y plane is parallel to the second X-Y plane, wherein each unit cell in the plurality of unit cells defined by the sidewalls of the X-Y isolation structure is open on a first end adjacent the first X-Y plane, wherein each unit cell in the plurality of unit cells defined by the sidewalls of the X-Y isolation structure is open on a second end adjacent the second X-Y plane, and wherein the X-Y isolation structure is formed as a conductive grid; a Z isolation structure, wherein the Z isolation structure includes a planar first surface that is joined to the first surface of the X-Y isolation structure and extends along the first X-Y plane and across a first side of the plurality of unit cells of the X-Y isolation structure, wherein the Z isolation structure closes each unit cell in the plurality of unit cells defined by the sidewalls of the X-Y isolation structure on the first end adjacent the first X-Y plane, and wherein each unit cell in the plurality of unit cells defined by the sidewall of the X-Y isolation structure remains open on the second end adjacent the second X-Y plane; and an array of coupling elements, wherein at least one coupling element is included in each of the plurality of unit cells of the X-Y isolation structure; wherein the Z isolation structure includes a substrate, and wherein each coupling element in the array of coupling elements is formed on the substrate of the Z isolation structure.

2. The antenna test fixture of claim 1, wherein the substrate of the Z isolation structure on which coupling elements in the array of coupling elements are formed is part of a multilayered structure.

3. The antenna test fixture of claim 2, further comprising:
a feed network, wherein each of the coupling elements in the array of coupling elements is connected to the feed network.

4. The antenna test fixture of claim 3, wherein the feed network is formed as part of the multilayered structure.

5. The antenna test fixture of claim 4, further comprising:
an antenna having an array of antenna elements formed on an antenna substrate, wherein the second surface of the X-Y isolation structure is in contact with the antenna substrate, and wherein each antenna element in the array of antenna elements is located within a unit cell included in the plurality of unit cells.

6. An antenna test system, comprising: an antenna, including a substrate; and a plurality of antenna elements disposed on the substrate; a test fixture, including: an X-Y isolation structure, wherein the X-Y isolation structure includes walls that define sidewalls of a plurality of unit cells, wherein the sidewalls of the walls defined by the X-Y isolation structure extend along a Z axis direction, wherein a first end of the walls of the X-Y isolation structure define a first surface that lies within a first X-Y plane, wherein a second end of the walls of the X-Y isolation structure define a second surface that lies within a second X-Y plane, wherein the first X-Y plane is parallel to the second X-Y plane, wherein each unit cell in the plurality of unit cells defined by the sidewalls of the X-Y isolation structure is open on a first end adjacent the first X-Y plane, wherein each unit cell in the plurality of unit cells defined by the sidewalls of the X-Y isolation structure is open on a second end adjacent the second X-Y plane, and wherein the X-Y isolation structure is formed as a conductive grid; a Z isolation structure, wherein the Z isolation structure includes a planar first surface that is joined to the first surface of the X-Y isolation structure and extends along the first X-Y plane and across a first side of the plurality of unit cells of the X-Y isolation structure, wherein the Z isolation structure closes each unit cell in the plurality of unit cells defined by the sidewalls of the X-Y isolation structure on the first end adjacent the first X-Y plane, and wherein each unit cell in the plurality of unit cells defined by the sidewalls of the X-Y isolation structure remains open on the second end adjacent the second X-Y plane; and an array of coupling elements, wherein at least one coupling element is included in each of the plurality of unit cells of the X-Y isolation structure, wherein the Z isolation structure includes a substrate, and wherein each coupling element in the array of coupling elements is formed on the substrate of the Z isolation structure, wherein the substrate of the antenna is in contact with the second surface of the X-Y isolation structure; and wherein each antenna element in the plurality of antenna elements is received in a unit cell of the plurality of unit cells.

7. The antenna test system of claim 6, further comprising test electronics, wherein the test electronics are operative to send signals to or receive signals from the array of coupling elements of the test fixture.

8. The antenna test system of claim 7, further comprising:
an input/output interface, wherein the test electronics are operatively connected to the antenna by the input/output interface.

9. The antenna test system of claim 8, wherein the test electronics send signals to the plurality of antenna elements of the antenna, and wherein the test electronics receive signals from the array of coupling elements.

10. The antenna test system of claim 8, wherein the test electronics send signals to the array of coupling elements, and wherein the test electronics receive signals from the plurality of antenna elements.

11. The antenna test fixture of claim 1, wherein coupling elements in the array of coupling elements are disposed on the planar first surface of the Z isolation structure.

12. The antenna test fixture of claim 1, wherein the Z isolation structure includes a planar second surface that is opposite the planar first surface, and wherein coupling elements in the array of coupling elements are disposed on the planar second surface of the Z isolation structure.

13. The antenna test fixture of claim 5, wherein the feed network mirrors a feed network included in the antenna.

14. The antenna test fixture of claim 3, further comprising:
a switching network; and
test electronics, wherein the switching network is operable to connect coupling elements in the array of coupling elements to the test electronics, and wherein the test electronics are operable to at least one of send signals to and receive signals from the coupling elements in the array of coupling elements.

15. The antenna test fixture of claim 14, wherein the switching network is integral to the antenna test fixture.

* * * * *